United States Patent [19]

Hertel et al.

[11] Patent Number: 4,744,709
[45] Date of Patent: May 17, 1988

[54] LOW DEFLECTION FORCE SENSITIVE PICK

[75] Inventors: Richard J. Hertel, Bradford; Leo V. Klos, Newburyport, both of Mass.

[73] Assignee: Varian Associates, Inc., Palo Alto, Calif.

[21] Appl. No.: 32,204

[22] Filed: Mar. 30, 1987

[51] Int. Cl.$^4$ ............................................. B65G 65/00
[52] U.S. Cl. .................................... 414/21; 177/211; 177/229; 414/331; 901/46
[58] Field of Search ................ 414/21, 182, 331, 416, 414/180; 901/46; 177/50, 211, 229

[56] References Cited

U.S. PATENT DOCUMENTS

| | | |
|---|---|---|
| 565,271 | 8/1896 | Henrich . |
| 1,380,199 | 5/1921 | Felix . |
| 2,842,633 | 7/1958 | Roach . |
| 3,059,710 | 10/1962 | Pien .................................. 414/21 X |
| 3,218,695 | 1/1963 | Fisher . |
| 4,132,318 | 1/1979 | Wang et al. ...................... 414/21 X |
| 4,519,130 | 5/1985 | Schaefer . |
| 4,558,757 | 12/1985 | Mori et al. ...................... 177/211 X |
| 4,616,511 | 10/1986 | Gindy et al. ...................... 901/46 X |
| 4,621,331 | 11/1986 | Iwata . |
| 4,636,140 | 1/1987 | Aldridge ......................... 414/182 X |

Primary Examiner—Leslie J. Paperner
Assistant Examiner—Stuart J. Millman
Attorney, Agent, or Firm—Stanley Z. Cole; Gerald M. Fisher; Terrence E. Dooher

[57] ABSTRACT

A tactile pick includes a base and a lever attached beneath the base by a pivot. A load sensing device including a strain gauge is located between the base and the portion of the lever on one side of the pivot; the portion of the lever on the other side of the pivot is adapted to receive a semiconductor wafer. Rotation of the lever about the pivot induced by the weight of a wafer causes an actuator to depress a flexible member on which a strain gauge is mounted. The output signal of the strain gauge is processed by a controller to provide an output signal which varies monotonically with the magnitude of the weight placed on the wafer receiving portion of the lever. The pick is employed in connection with the wafer transport system which transfers wafers from a cassette to the pick lever.

10 Claims, 4 Drawing Sheets

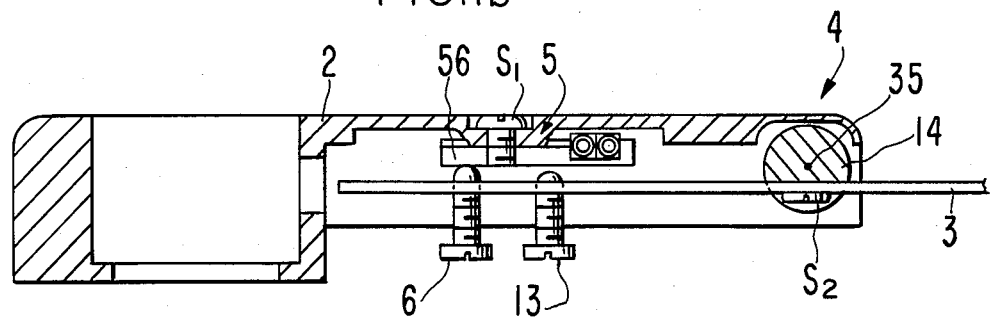
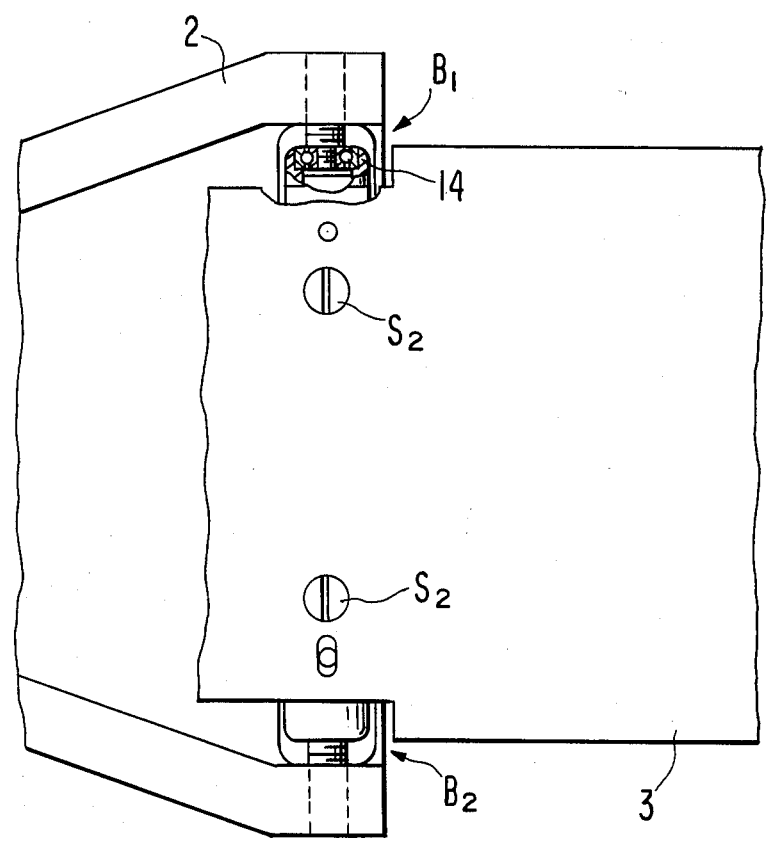

LOW DEFLECTION FORCE SENSITIVE PICK

FIELD OF THE INVENTION

This invention relates to apparatus for transporting semiconductor wafers and in particular to a tactile wafer pick capable of sensing very light loads, but which deflects only slightly when loaded with a semiconductor wafer.

BACKGROUND OF THE INVENTION

Prior art wafer picks include solid cantilever picks without sensing elements. Such a pick is unable to sense when a wafer is present on the pick or when only a portion of the wafer is present, which leads to reliability problems in automated semiconductor handling.

SUMMARY OF THE INVENTION

A sensitive tactile pick is provided for handling semiconductor wafers. The pick includes a base and a lever attached beneath the base by a pivot. A load sensing device including a strain gauge is located between the base and the portion of the lever on one side of the pivot; the portion of the lever on the other side of the pivot is adapted to receive a semiconductor wafer.

Rotation of the lever about the pivot induced by the weight of the wafer causes an actuator to depress a flexible member on which the strain gauge is mounted. A stop is provided to prevent damage to the sensing elements by excessive rotation of the lever. The load sensing device is connected to a controller and the output signal derived from the strain gauge is processed by the controller to provide an analog output signal which varies monotonically with the magnitude of the weight placed on the wafer receiving portion of the lever. In one embodiment the load sensing device includes two strain gauges so that the output signal of the controller is compensated for variations in temperature.

The tactile pick of the invention is employed in a wafer transport system which includes means for extending the lever between wafer supports in a wafer cassette and for providing relative motion between the lever and the cassette so that a wafer may be transferred from the cassette to the pick.

The pick has a small vertical dimension suitable for use in a vacuum chamber. The tactile pick also has a sensitivity which can be employed to initialize the position of wafers in a cassette relative to the wafer pick once the location of the first wafer is sensed.

BRIEF DESCRIPTION OF THE DRAWINGS

FIG. 1b shows a more detailed cross section of the pick of FIG. 1;

FIG. 1c shows a partially cut away bottom view of a portion of the pick of FIG. 1;

FIG. 3 shows a schematic plan view of the load cell 5 in FIG. 2a;

DETAILED DESCRIPTION OF THE INVENTION

Figure 1A:
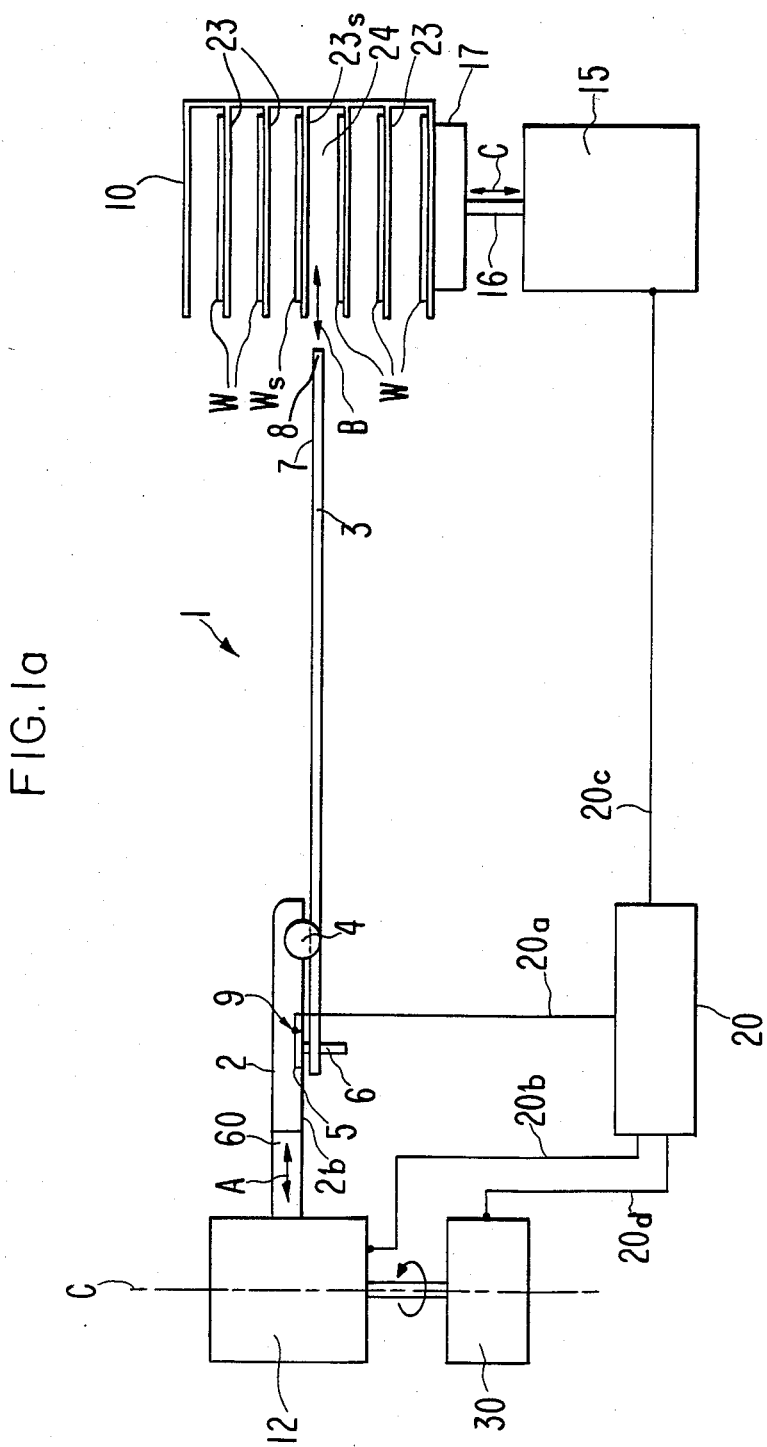
FIG. 1a shows a partially schematic side view of one embodiment of the wafer pick of the invention.

FIG. 1a shows a partially schematic side view (not to scale) of one embodiment of wafer pick 1 of the present invention. Wafer pick 1 includes a first arm member (base) 2 and a second arm member (pick arm) 3 which is pivotally attached to base 2 by pivot 4. A sensing means 9 includes a load cell 5 attached to base 2 and an actuator 6 attached to pick arm 3. Load cell 5 is described in detail below in connection with FIGS. 3, 4 and 5. Actuator 6, which may be for example an adjustable set screw, protrudes from top surface 7 of pick arm 3 beneath load cell 5.

Wafer pick 1 is particularly adapted for use in conjunction with a typical wafer cassette 10 driven by servo motor 15 which causes shaft 16 and wafer cassette support plate 17 to be driven in a vertical direction as indicated by arrow C. Typically, the top surface of wafer support plate 17 is inclined at a small angle from the horizontal, for example 1°, so as to better retain wafers, each denoted by W, in cassette 10. Each of the wafers rests on a corresponding support/spacer 23 (shown schematically in FIG. 1a).

In operation, when a selected wafer $W_S$ is to be removed from cassette 10, servo motor 15 drives wafer cassette 10 so that end 8 of pick arm 3 is positioned opposite the space 24 beneath the spacer $23_s$ which supports the selected wafer $W_S$ and above the next lower wafer W in cassette 10. Each support/spacer 23 supports only a peripheral portion of a wafer. Servo motor 15 is then stopped and motor 12 drives shaft 60 attached to base 2 linearly as indicated by arrow A in FIG. 1 so that end 8 is extended through the open side of cassette 10 into space 24 as indicated by arrow B (which is parallel to arrow A and parallel to the planes of the wafer supports 23 of wafer cassette 10). When arm 8 has been fully extended into cassette 10 beneath wafer $W_S$, the servo motor 15 is again actuated to lower cassette 10 until the top wafer bearing surface 7 of pick arm 3 contacts the lower side of selected wafer $W_S$ and continues until the wafer cassette is lowered so that the selected wafer $W_S$ is totally supported by surface 7 and the center of wafer $W_S$ is positioned approximately midway between wafer support $23_s$ and the wafer support immediately above it. In this position the clockwise torque about pivot 4 is the downward force exerted by the weight of wafer $W_S$ on surface 7 multiplied by the lever arm, that is, the distance from the pivot 4 to the point where the center of gravity of the selected wafer $W_S$ passes through pick arm 3. This torque causes pick arm 3 to rotate slightly in a clockwise direction around pivot 4 which causes actuator 6 to depress a flexible member 52 (shown in FIG. 4) of load cell 5. Load cell 5 is sensitive enough to provide a signal to controller 20 via line 20a from which the weight of wafer $W_S$ resting on surface 7 can be approximated and the rotation is small enough so that neither pick arm 3 nor wafer $W_S$ resting thereon contact either wafer support $23_s$ or the wafer support immediately above support $23_s$. Assuming that the weight derived by controller 20 from the signal provided by load cell 5 indicates that a wafer of proper weight is held on the end of pick 8, controller 20 actuates motor 12 to cause shaft 60 to translate base 2 and therefore pick arm 3 so as to withdraw the wafer loaded thereon clear of wafer cassette 10.

Controller 20 stores an acceptable range of weights for wafers W and, if the weight of the wafer $W_S$ does not fall within this range, controller 20 provides an output signal indicating that a wafer of improper weight is loaded on arm 3 indicating a broken wafer or that no wafer is present on arm 3.

It is critical in the construction of pick arm 1 to adjust the dimensions of the components so that the pick arm is sensitive to the weight of the wafer placed thereon and yet rotates a very small amount when loaded so that the selected wafer and the pick arm 3 do not contact either the wafer support immediately above the selected wafer or the wafer support immediately below the selected wafer when the selected wafer is being withdrawn from wafer cassette 10.

If desired, motor 12 and pick 1 attached thereto may be rotated by motor 30 through a selected angle about axis C to present selected wafer $W_S$ to other wafer handling equipment (not shown). Controller 20 controls the operation of driving motors 12, 15 and 30 via lines 20b, 20c, and 20d, respectively.

Wafer pick 1 is also useful in other system configurations. For example in another configuration, base 2 is attached to an articulated arm (not shown) which extends base 2 and therefore arm 3 pivotally attached thereto, into cassette 10. A wafer is then transferred to surface 7 by the motion of cassette 10 as explained above. The articulated arm then withdraws the wafer pick 1 carrying selected wafer $W_S$ from cassette 10 and presents the selected wafer $W_S$ to other wafer handling equipment (not shown). In another system configuration (not shown) wafer cassette 10 is stationary and a motor (not shown) drives base 2 in a vertical direction to provide the relative motion between arm 3 and wafer cassette 10 necessary to transfer a wafer from cassette 10 to arm 3.

Since the force of gravity holds the selected wafer $W_S$ to wafer bearing surface 7, wafer pick 1 is suitable for operation in a vacuum chamber. In this environment it is important to minimize the vertical aspect of wafer sensing pick 1 since pick 1, when located in a vacuum chamber, will typically be extended by an articulated arm through narrow openings between vacuum chambers or through entrance or exit orifices in vacuum chambers to receive or unload wafers. The location and construction disclosed for sensing device 9 provides a tactile pick having a very small vertical dimension.

FIG. 1b shows a portion of a more detailed cross-sectional view of wafer pick 1. Load cell 5 is attached to base 2 by means of screws $S_1$ extending into body 56. Adjustable set screw 6 extends through arm member 3 toward load cell 5 and preferably has an actuating tip in the form of a hemisphere. Member 13 which does not extend as far through arm 3 as actuator 6, acts as a stop to prevent excessive rotation of arm member 3 about axis of rotation 35 thereby preventing damage from undue flexing of a flexible member 52 (see FIG. 3) in load cell 5. Cylindrical member 14 of pivot 4 has a shelf cut into the central portion on one side of the cylindrical member to provide a flat region for attachment of member 14 to arm member 3 by means of screws $S_2$. Each end of cylindrical member 14 contains an antifriction ball bearing assembly in contact with housing 2 to provide a low friction pivot about central axis 35 of cylinder 14.

FIG. 1c shows a partially cut-away bottom view of pick assembly 1. Screws $S_2$ attach arm member 3 to cylindrical rod 14 and ball bearing assemblies $B_1$ and $B_2$ mount rod 14 to base 2.

Figure 2A:
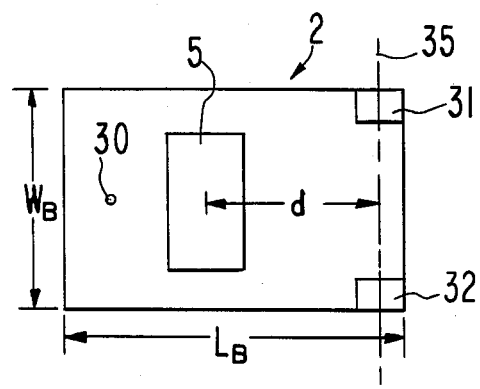
FIG. 2a provides a schematic plan view of the base of the pick.

FIG. 2a shows a schematic plan view (not to scale) of base 2. In the embodiment shown in FIG. 2a, base 2 is made of aluminum and has width $W_B$ and a length $L_B$ selected to accommodate load cell 5. In this embodiment the distance d between axis 35 of pivot 4 and the center of load cell 5 is approximately 1½ inches. A small circular opening 30 permits base 2 to be bolted to the mechanical member, e.g., shaft 60 (FIG. 1) or an articulated arm (not shown), which drives base 2.

Squares 31 and 32 indicate the location of bearing assemblies $B_1$ and $B_2$ when arm 3 is mounted to base 2.

Figure 2B:
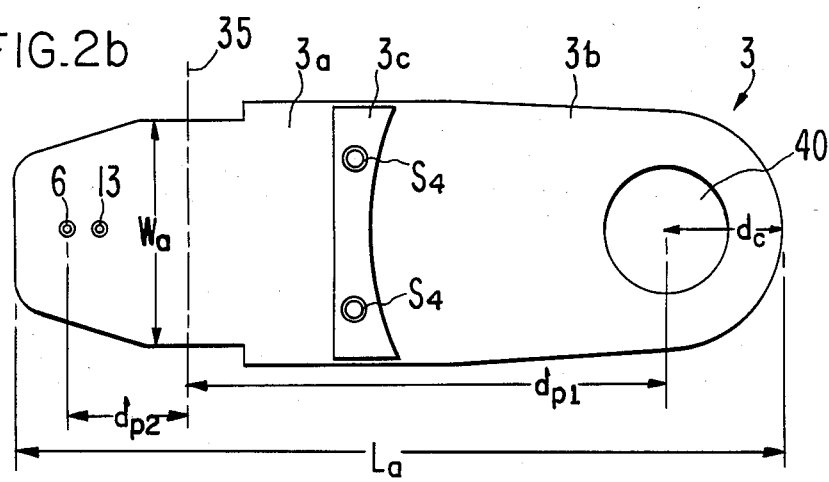
FIG. 2b shows a plan view of pick arm 3.

FIG. 2b shows a plan view (not to scale) of pick arm 3. In the embodiment shown in FIG. 2b, pick arm 3 is made of stainless steel and has length $L_a$ which can be varied by selecting the length of detachable portion 3b and a thickness of 0.050 inches. The width $W_a$ is conveniently approximately 2¼ to 3 inches. Circular opening 40 is provided in pick arm 3 to permit a mechanical member, not shown, to extend through opening 40 to elevate a wafer (not shown) resting on top surface 7 of pick arm 3. The distance $d_c$ between end 8 of pick arm 3 and the center C of opening 40 is approximately 1.2 inches. For one choice of section 3b, the distance $d_{p1}$ between center C and pivot axis 35 is approximately 4.5 inches. The length of the lever arm $d_{p2}$ of actuator 6 is approximately 1½ inches.

As shown in FIG. 2b, arm member 3 is comprised of two sections, section 3a attached to cylinder 14, (not shown in FIG. 2b) and wafer-bearing section 3b which is detachably mounted to section 3a by screws $S_4$ extending through mounting plate 3c. Section 3b is proportioned in size to the size of the wafer to be transferred to arm 3.

When pick arm 3 is extended into wafer cassette 10 to unload a wafer, it is extended so that the center of opening 40 is directly beneath the center of the wafer, which has a larger diameter than the diameter of the opening. Thus, when the wafer is transferred to pick arm 3 as explained above, the center of gravity of the wafer coincides with the center of opening 40 and thus for one choice of section 3b has a lever arm of approximately 4½ inches. In this case, the mechanical advantage of the lever is approximately 4½:1½ or approximately 3 to 1. Pick arm 3 described above has been dimensioned to accommodate wafers having a diameter in the range between 3 and 8 inches, but it is obvious that the dimensions can be modified to accommodate larger (or smaller) wafers, if desired. The pick may also be dimensioned to provide other desired mechanical advantages; however, the dimensions provided yield good sensitivity and acceptably small load deflection of end 8 of pick arm 3 when a wafer is loaded on the end of pick arm 3.

Figure 3:
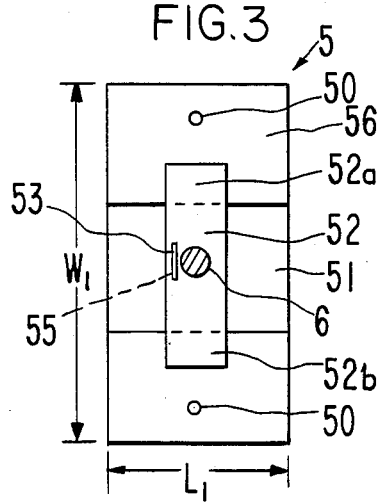
Figure 4:
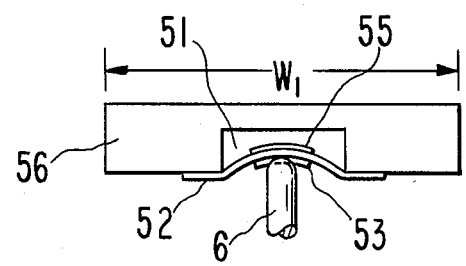
FIG. 4 shows a side view of the load cell of FIG. 3.

FIG. 3 shows a schematic plan view and FIG. 4 shows a schematic cross-sectional side view of load cell 5 in FIG. 2a. Load cell 5 is mounted to base 2 by screws (not shown) through openings 50 in load cell body plate 56. Plate 56 is made of stainless steel and has a length $L_1$ and a width $W_1$ selected to accommodate flexible member 52, hereinafter flexure 52. In one embodiment flexure 52 is a rectangular strip made from 302 stainless steel. Each end 52a and 52b of flexure 52 is spot-welded to body plate 56 so that flexure 52 extends across groove 51 in plate 56.

Figure 5A:
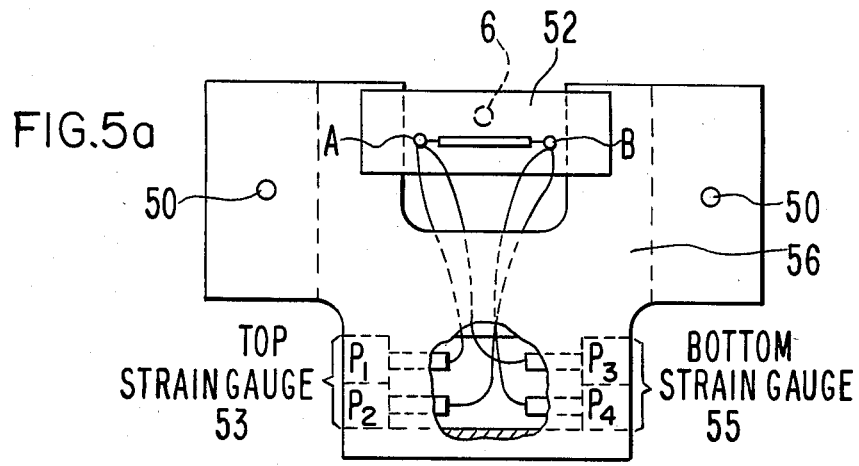
FIGS. 5a, 5b and 5c show the connections of the strain gauges in the load cell.
Figure 5B:
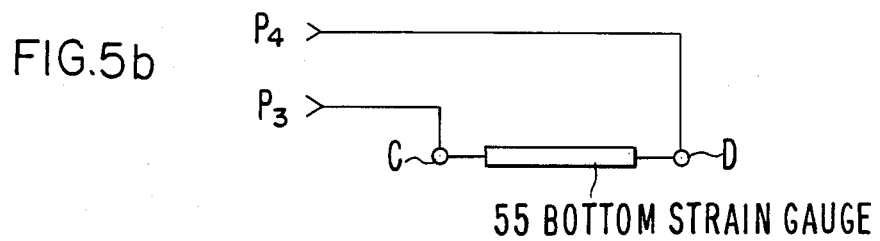
Figure 5C:
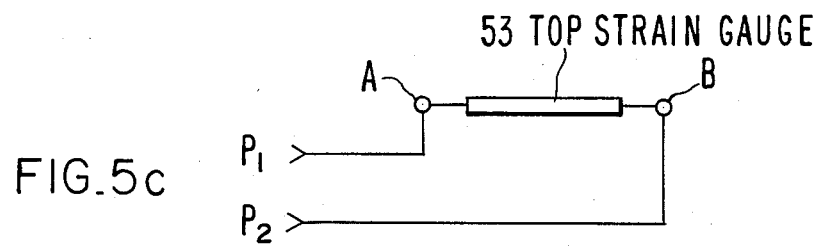

Strain gauges 53 and 55 (only one of which is visible in FIG. 3) are fixed in register with one another, one on each side of flexure 52 by use of a suitable strain gauge adhesive. Strain gauges 53 and 55 are solid state strain gauges containing a semiconductor strip. Strain gauges 53 and 55 are connected as shown in FIGS. 5a-5c to output pins $P_1$, $P_2$ and $P_3$, $P_4$, respectively. Ends A and B of strain gauge 53 are connected to output pins $P_1$ and $P_2$ respectively. Ends C and D of strain gauge 55 are connected to output pins $P_3$ and $P_4$ respectively. Output pins $P_1$, $P_2$, $P_3$ and $P_4$ are connected to controller 20. Controller 20 derives a signal from each gauge which represents the change in resistance in the gauge due to force exerted on flexure 52 by actuator 6. Utilizing a bridge network (not shown), controller 20 processes these signals to provide a temperature compensated output signal representing the change in resistance due to strain on flexure 52.

As shown in FIG. 3, strain gauges 53 and 55 are located slightly off center of flexure 52 so that the tip of actuator 6, denoted by a phantom circle in FIG. 3, does not impinge on a strain gauge.

Unloaded pick arm (lever) 3 tends to rotate clockwise about pivot 4 until stopped by actuator 6 pressing against flexure 52. The resistance of the strain gauge under this unweighted biased condition is taken as the baseline resistance measurement. If desired, a mechanical stop 13 protruding from lever surface 7 as shown in FIG. 1b (or alternatively from the lower surface of base 2) may be provided to prevent excessive rotation of arm member 3. Stop 13 contacts body plate 56.

For one embodiment of the pick arm described above, the change in resistance, delta R (measured in ohms) sensed by load cell 5 and provided by controller 20 when a typical 3-inch semiconductor wafer weighing 0.014 lb is loaded on wafer arm surface 7 is approximately 100 ohms. It is assumed that the center of gravity of the applied weight passes through the center of opening 40. The delta R signal derived by controller 20 from load cell 5 is an analog signal which varies monotonically with the weight pressing down on surface 7. Since the delta R value for a light wafer is large (approximately 100 ohms), controller 20 can easily distinguish various fractions of the weight of even a 3-inch wafer. By storing disjoint nominal ranges for delta R for acceptable weights of wafers of various dimensions and by then comparing a sensed delta R with these ranges, controller 20 can determine the size of the wafer from the delta R signal produced by its weight and can determine when a sensed delta R is not in a selected range. This indicates the wafer has an improper weight which may be due to a broken wafer. A delta R of 0 indicates a wafer was not transferred to arm 3. Controller 20 provides a first value of an output signal to indicate that a wafer of desired weight is loaded on the pick arm 3 and one or more additional output signal values to indicate otherwise. In particular, a second output signal value is provided to indicate that a wafer was not transferred to pick arm 3. In general, controller 20 provides an analog output signal that varies monotonically with the weight pressing on surface 7.

Of importance, the deflection (displacement), delta, δ, of pick arm 3 at end 8 due to rotation about pivot axis 35 under the load of a typical 3-inch, 4-inch, 5-inch, 6-inch and 8-inch wafer centered at C (FIG. 2c) is only 0.0025 inches, 0.008 inches, 0.012 inches, 0.018 inches and 0.029 inches respectively. Since the distance between adjacent wafer supports in wafer cassette 10 is typically approximately 0.1875 inches, and since wafer thickness typically ranges between 0.020 and 0.040 inches, the maximum deflection (displacement) expected for an 8-inch wafer loaded on surface 7 still allows ample room between supports to insert or withdraw pick arm 3 with the wafer loaded thereon from cassette 10 without touching either of the supports.

The great sensitivity of the tactile pick of the present invention also enables controller 20 to initialize system 1 in the following manner. When the lowest wafer in cassette 10 begins to be transferred to pick arm 3, and only a small fraction of its weight has been transferred to pick arm 3, controller 20 senses the beginning of the transfer and thus can calculate the position of this lowest wafer relative to pick arm 3. The location of the remaining wafers in cassette 10 can then be calculated by controller 20 from the known separation of support/spacers 23.

In another embodiment of the invention (not shown) load cell 5 is attached to arm 3 and actuator 6 is located above it on base 2. However, this is not the preferred embodiment. The embodiment shown in FIG. 1 with the load cell 5 attached to base 2 is preferred, since the electrical wires from the load cell in base 2 are connected to controller 20 and the arm 3 having no electrical connections can be easily interchanged with a similar arm of different length to accommodate wafers of different size.

Another advantage of the above design is that the flow of heat from a hot wafer loaded on pick arm 3 is in large measure blocked from reaching sensing elements in cell 5 by the pivot structure 4.

While the above embodiments have employed stainless steel for flexure 52 in load cell 5, the suitability of any flexible material for flexure 52 and an appropriate length $L_F$ for the flexure may be investigated using the following theoretical considerations for a given flexure material having Young's modulus E. The stress $\sigma$ is related to the strain by the following formula: $\sigma = E \times$ strain where the strain is chosen to be sufficiently large to produce an acceptably large delta R signal from the strain gauge adhered to the flexure. For example, for a flexure of stainless steel and choosing a strain of 500 micro units (500με) the stress, $$\begin{aligned} \sigma &= E \times \text{strain} \\ &= (30 \times 10^6 \text{ psi})(500 \times 10^{-6}) \\ &= 15{,}000 \text{ psi} \end{aligned}$$

Having determined the stress, $\sigma$ and assuming the width $W_F$ and the thickness $H_F$ of the flexure 52, one may solve for the bending moment M by using the relationship $\sigma = MC/I$, where C is the distance from the center of gravity (neutral axis) to the outer surface (fiber) and I is moment of inertia about the neutral axis given by $I = W_F H_F^3/12$.

Thus, for example, if $W_F$ is chosen to be 0.2 inches and if $H_F$ is chosen to be 0.002 inches, it follows that C equals 0.001 inches and $M = \sigma I/C = \sigma W_F H_F^3/12C = 0.002$ inch-lb.

Using the relationship $L_F = 8M/W_0 \times$ (lever ratio), one can then calculate the approximate length for a selected weight $W_0$. For example, if $W_0 = 0.014$ lb (the approximate weight of a 3 inch wafer), and if the lever ratio is 3, then $L_F = 0.38$ inches.

The deflection, δ, of the flexible member caused by the actuator can be calculated using the relationship $\delta = W_0 L_F^3/192EI$. Using the above assumptions and calculated values one sees that $\delta = 0.003$ inches, which corresponds to a deflection of 0.009 inches at the point C (FIG. 2) on pick arm 3 assuming a lever arm ratio of 3:1. This is an acceptably small deflection for pick arm 3. The above embodiments are intended to be exemplary and not limiting and in light of the above disclosure many modifications will be obvious to one of average skill in the art without departing from the scope of the invention.

What is claimed is:

1. A wafer handling device comprising:

a first arm member;

a second elongated arm member partially extending beneath said first arm member and attached thereto by a pivot, said second arm member having a first portion on one side of said pivot and a second portion adapted for receiving a wafer on the other side of said pivot;

means for sensing a wafer transferred to said second arm member, said means for sensing being located on said one side of said pivot and comprising a load cell including a first strain gauge attached to a flexible member attached to one of said first arm member and said first portion and a member for actuating said strain gauge extending toward said flexible member from the other of said first arm member and said first portion, so that the weight of a wafer transferred to said second arm member causes said second arm member to rotate about said pivot so that said member for actuating stretches said flexible member; and means, responsive to said means for sensing, for providing a signal having a first value when a wafer having a weight in a selected range is received by said second portion and a second value different from said first value when a wafer is not received by said second portion.

2. A wafer handling device as in claim 1 further including means, attached to said first arm member for laterally extending said first arm member and said second arm member attached thereto.

3. A wafer handling device as in claim 1 wherein said signal provided by said means for providing is an analog signal varying monotonically with the weight impinging on said second portion.

4. A device as in claim 1 wherein said flexible member is attached to said first arm member and said member for actuating is attached to said first portion of said second arm member.

5. A device as in claim 1 wherein said means for sensing includes a second strain gauge and said means for providing includes means for providing a temperature compensated output signal derived from an output signal of said first strain gauge and an output signal of said second strain gauge.

6. A device as in claim 1 wherein said second portion of said elongated arm member comprises a first section and a second, wafer-receiving section, said second section being removably attached to said first section so that a wafer of a selected size can be received by said second arm member by attaching said second section to said first section, said second section being proportionate in size to said wafer.

7. A device as in claim 4 further including a stop member for preventing rotation of said second arm member, said stop member extending between said first arm member and said second arm member.

8. A wafer handling assembly comprising in combination:

a wafer handling device as in claim 2;

a wafer cassette having at least a first and a second wafer support separated by a selected distance delta;

said wafer cassette and said wafer handling device being positioned relative to one another so that said second arm member is extendable by said means for laterally extending to a position in said cassette beneath the lower of said first and said second wafer supports; and means for causing relative motion between said first arm member and said cassette in order to transfer a wafer from said lower support to said second arm member, said member for actuating and said flexible member being dimensioned and positioned relative to one another so that rotation of said second arm member about said pivot under the weight of said wafer causes a maximum displacement of said second portion of said second arm member sufficiently less than delta so that said selected wafer and said second portion deflected by said wafer do not contact either said first support or said second support.

9. A wafer assembly as in claim 8 wherein said means for causing relative motion comprises a servo motor for driving a base member for supporting said cassette.

10. A wafer pick comprising:

a base;

a lever partially extending beneath said base and attached thereto by a pivot, said lever having a first portion on one side of said pivot and a second portion on the other side of said pivot adapted for receiving a wafer;

means for sensing a wafer transferred to said second portion, said means for sensing being located on said one side of said pivot and comprising a load cell including a strain gauge attached to a flexible member attached to one of said base and said first portion and a member for actuating said strain gauge extending toward said flexible member from the other of said base and said first portion, so that the weight of a wafer transferred to said second arm member causes said second arm member to rotate about said pivot so that said member for actuating stretches said flexible member; and means, responsive to said means for sensing, for providing a signal having a first value when a wafer having a weight in a selected range is received by said second portion and a second value different from said first value when a wafer is not received by said second portion.

* * * * *